(12) United States Patent
Ni et al.

(10) Patent No.: US 9,080,863 B2
(45) Date of Patent: Jul. 14, 2015

(54) METHOD FOR MONITORING ALIGNMENT BETWEEN CONTACT HOLES AND POLYCRYSTALLINE SILICON GATE

(71) Applicant: Shangai Huali Microelectronics Corporation, Shanghai (CN)

(72) Inventors: Qiliang Ni, Shanghai (CN); Hunglin Chen, Shanghai (CN); Zhounan Wang, Shanghai (CN); Yin Long, Shanghai (CN); Mingsheng Guo, Shanghai (CN)

(73) Assignee: SHANGAI HUALI MICROELECTRONICS CORPORATION, Shanghai (CN)

( * ) Notice: Subject to any disclaimer, the term of this patent is extended or adjusted under 35 U.S.C. 154(b) by 117 days.

(21) Appl. No.: 13/731,294

(22) Filed: Dec. 31, 2012

(65) Prior Publication Data

US 2013/0342842 A1 Dec. 26, 2013

(30) Foreign Application Priority Data

Jun. 20, 2012 (CN) .......................... 2012 1 0204463

(51) Int. Cl.
| | |
|---|---|
| *G01B 11/00* | (2006.01) |
| *G01B 11/27* | (2006.01) |
| *H01L 21/66* | (2006.01) |
| *H01L 21/28* | (2006.01) |

(52) U.S. Cl.
CPC .......... *G01B 11/27* (2013.01); *H01L 21/28035* (2013.01); *H01L 22/30* (2013.01)

(58) Field of Classification Search
CPC ........ G01B 11/27; G01B 11/272; G03F 9/70; G03F 7/70358; H01L 21/681

USPC ................................... 356/399–401
See application file for complete search history.

(56) References Cited

U.S. PATENT DOCUMENTS

| | | | |
|---|---|---|---|
| 5,699,282 A | 12/1997 | Allen et al. | |
| 5,721,619 A * | 2/1998 | Hiruma et al. | ............... 356/401 |
| 6,130,750 A * | 10/2000 | Ausschnitt et al. | ........... 356/401 |
| 2003/0137628 A1* | 7/2003 | Nagaoka | ....................... 349/141 |
| 2004/0005778 A1* | 1/2004 | Kronke et al. | ................ 438/689 |
| 2004/0144928 A1* | 7/2004 | Abe et al. | ................. 250/441.11 |
| 2009/0084954 A1* | 4/2009 | Ezumi et al. | .................. 250/307 |
| 2011/0215243 A1* | 9/2011 | Ezumi et al. | .................. 250/307 |

FOREIGN PATENT DOCUMENTS

| | | |
|---|---|---|
| CN | 1400644 | 3/2003 |
| CN | 1490846 | 4/2004 |
| CN | 101009236 | 8/2007 |
| CN | 101197319 | 6/2008 |
| CN | 102435629 | 5/2012 |

* cited by examiner

*Primary Examiner* — Tarifur Chowdhury
*Assistant Examiner* — Isiaka Akanbi
(74) *Attorney, Agent, or Firm* — Robert L. Wolter, Esq.; Beusse Wolter Sanks & Maier, P.A.

(57) ABSTRACT

The present invention is related to the semiconductor manufacturing field, especially a method for monitoring alignment between contact holes and polycrystalline silicon gate by setting a plurality of equidistant contact holes with same sharp on poly-silicon and residual active area, and then obtain the process alignment profile of the quantized values in the plane in order to have a better control of process quality, thereby have a better control of the quality of the process.

6 Claims, 3 Drawing Sheets

ABSTRACT# METHOD FOR MONITORING ALIGNMENT BETWEEN CONTACT HOLES AND POLYCRYSTALLINE SILICON GATE

CROSS-REFERENCE TO RELATED APPLICATIONS

This application claims priority to Chinese Application No. 201210204463.0 filed Jun. 20, 2012, and incorporated herein by reference in its entirety.

FIELD OF THE INVENTION

The present invention is related to the semiconductor manufacturing field, especially a method for monitoring alignment between contact holes and polycrystalline silicon gate.

BACKGROUND OF THE INVENTION

With the development of integrated circuit manufacturing technology and the scale-down of critical dimensions, some new material and new technology are introduced to the integrated circuit manufacturing technology to meet the requirements of the overall function, so that the accuracy of the connection between such different structures is very important.

When the manufacturing technology is 65 nanometers or less, the slight misalign of alignment between the contact hole and the poly-silicon gate will cause the failure of the overall performance of the device; The present method of detecting the misalign between the two structures (contact hole and the poly-silicon gate) is mainly optical method, while such optical method will limited by resolution size. So it cannot meet the requirement of precise process control when the device size becomes smaller.

FIG. 1 is the structure diagram of defects under the electron microscope after the structure of the front-end device is formed; as shown in FIG. 1, the contact hole 11 is connected to the gate 12 and the active area because there is a certain misalign between the contact hole 11 and the poly-silicon gate 12 in the area 14, which will result in the failure of the performance of the entire device structure 1, thereby affect the yield of the product.

SUMMARY OF THE INVENTION

The present invention disclosed a method for monitoring alignment between contact holes and polycrystalline silicon gate, comprising the following steps:

1. A method for monitoring alignment between contact holes and polycrystalline silicon gate, comprising the following steps:

Step S1: providing poly-silicon gates on the active area of a semiconductor structure;

Step S2: setting a plurality of equidistant contact holes with same sharp on said poly-silicon and residual active area.

Step S3: detecting and to calculate the deviation value of the aligned process by electron method.

wherein the length of the poly-silicon gate is determined by the diameter of the contact hole, pitch of contact holes and the width of poly-silicon.

The method for monitoring alignment between contact holes and polycrystalline silicon gate mentioned above, the shape of poly-silicon gate is a rectangular structure from plan view.

The method for monitoring alignment between contact holes and polycrystalline silicon gate mentioned above, an electron microscope is used to detect the contact hole in said step S3.

The method for monitoring alignment between contact holes and polycrystalline silicon gate mentioned above, the length of said poly-silicon gate is at least $L/Z*M$, L is the width of the poly-silicon gate, Z is the interval between the adjacent contact hole along the width of the said poly-silicon gate, M is the diameter of the contact hole.

The method for monitoring alignment between contact holes and polycrystalline silicon gate mentioned above, the centers corresponding to said contact holes are on the same line.

The method for monitoring alignment between contact holes and polycrystalline silicon gate mentioned above, the first contact hole of the row that is comprised of said contact holes is deposed on the poly-silicon gate while the last contact hole of said row is deposed on active area.

The method for monitoring alignment between contact holes and polycrystalline silicon gate mentioned above, said deviation value is $L/2-T*Z$, L is the width of the poly-silicon gate, Z is the interval between the adjacent contact hole along the width of said poly-silicon gate, T is the count value of contact hole disposed on the poly-silicon gate whose image is begin to change in said contact hole row detected by electron method.

In summary, due to the above technical solution, the present invention disclosed a method for monitoring alignment between contact holes and polycrystalline silicon gate by setting a plurality of equidistant contact holes with same sharp on said poly-silicon and residual active area and then obtain the process alignment profile of the quantized values in the plane in order to have a better control of process quality, thereby improving the product yield.

DETAILED DESCRIPTION OF THE PREFERRED EMBODIMENT

The following context will make further description for the specific embodiments of present invention in conjunction with appended drawings.

Figure 1:
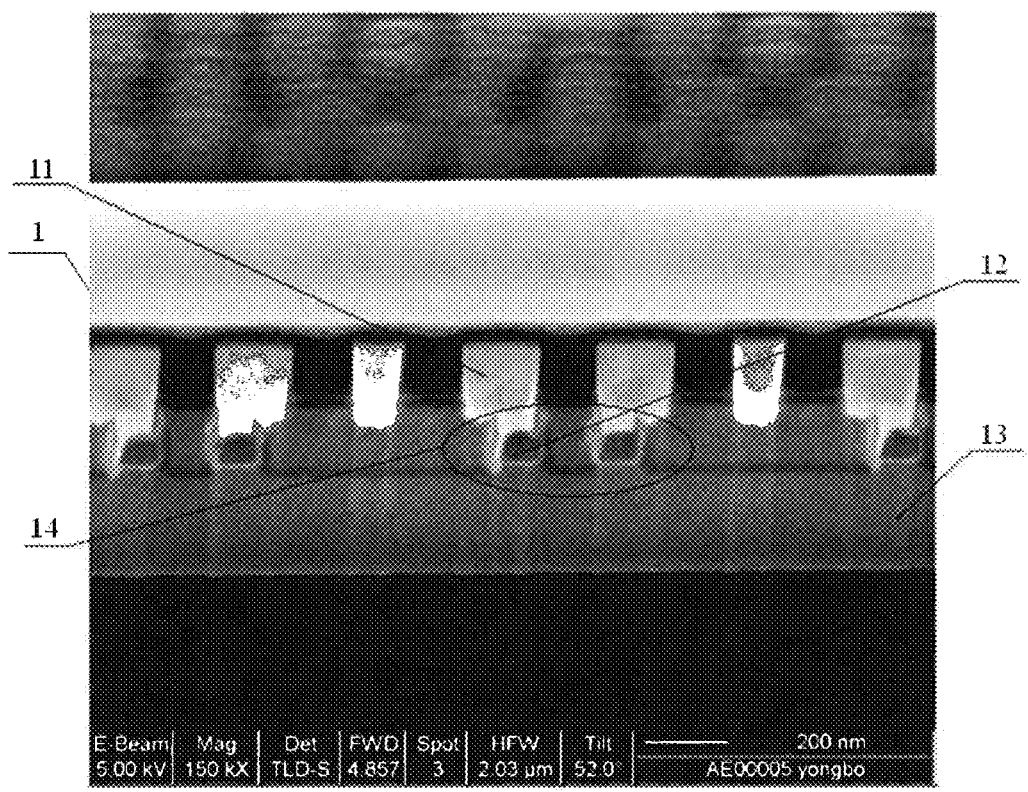
FIG. 1 illustrated the structure diagram of defects under the electron microscope after the structure of the front-end device is formed.
Figure 2:
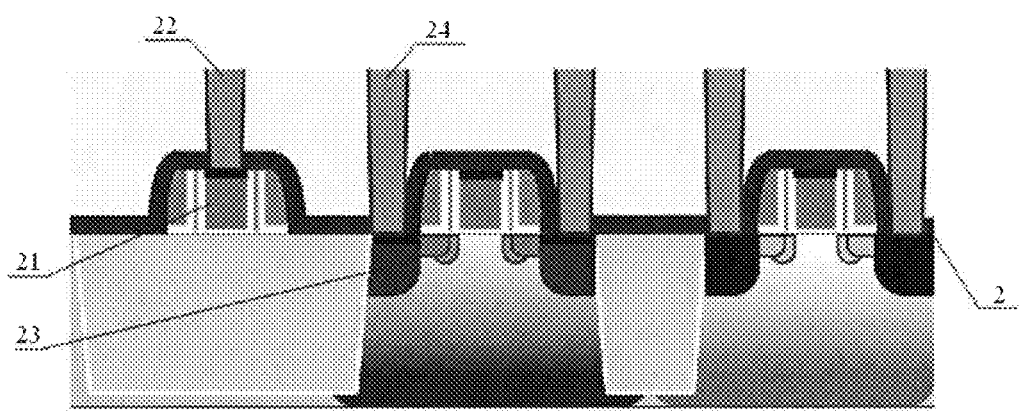
FIG. 2 illustrated the plan view of the relative location the contact hole in horizontal direction and the poly-silicon gate in a method for monitoring alignment between contact holes and polycrystalline silicon gate according to the disclosure.
Figure 3:
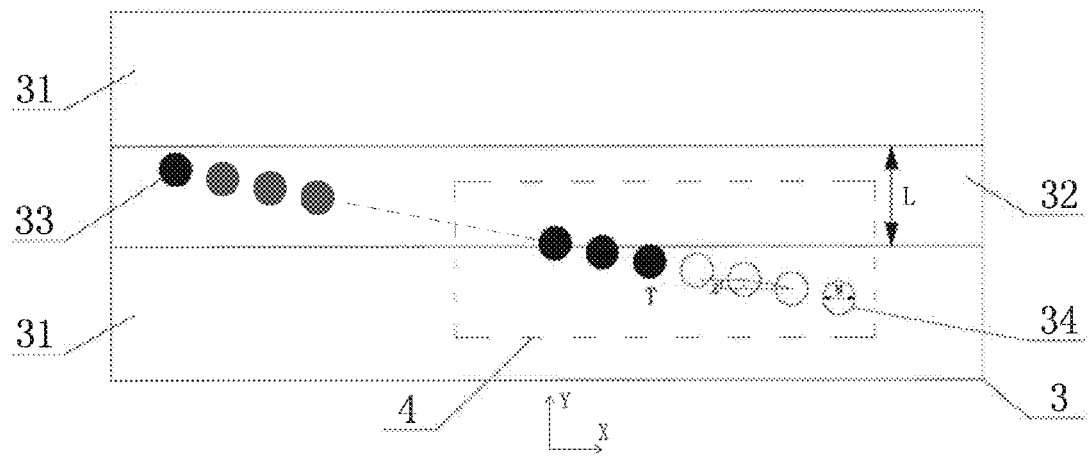
FIG. 3 illustrated an enlarged schematic view of part of the contact hole area in FIG. 2 in a method for monitoring alignment between contact holes and polycrystalline silicon gate according to the disclosure.
Figure 4:
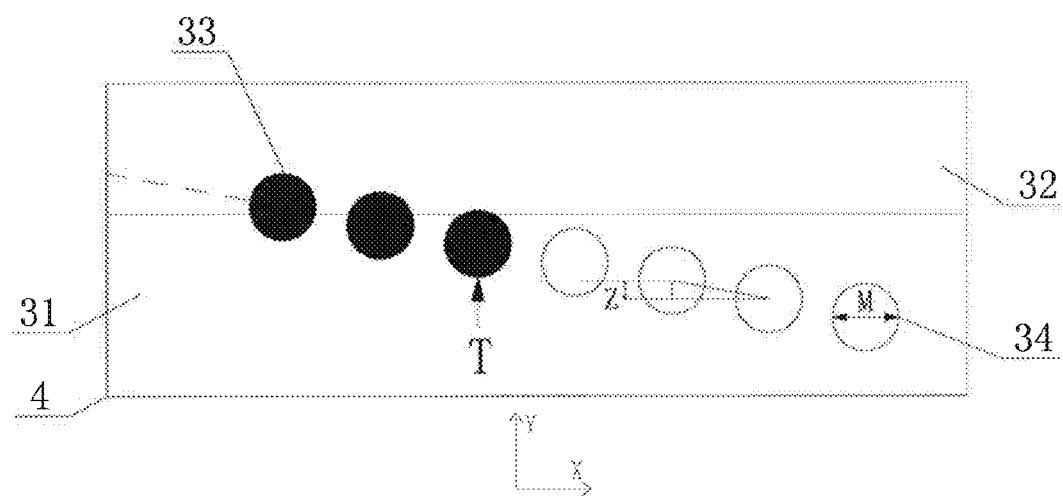
FIG. 4 illustrated the diagram of the structure after the front-end devices is formed in a method for monitoring alignment between contact holes and polycrystalline silicon gate according to the disclosure.
Figure 5:
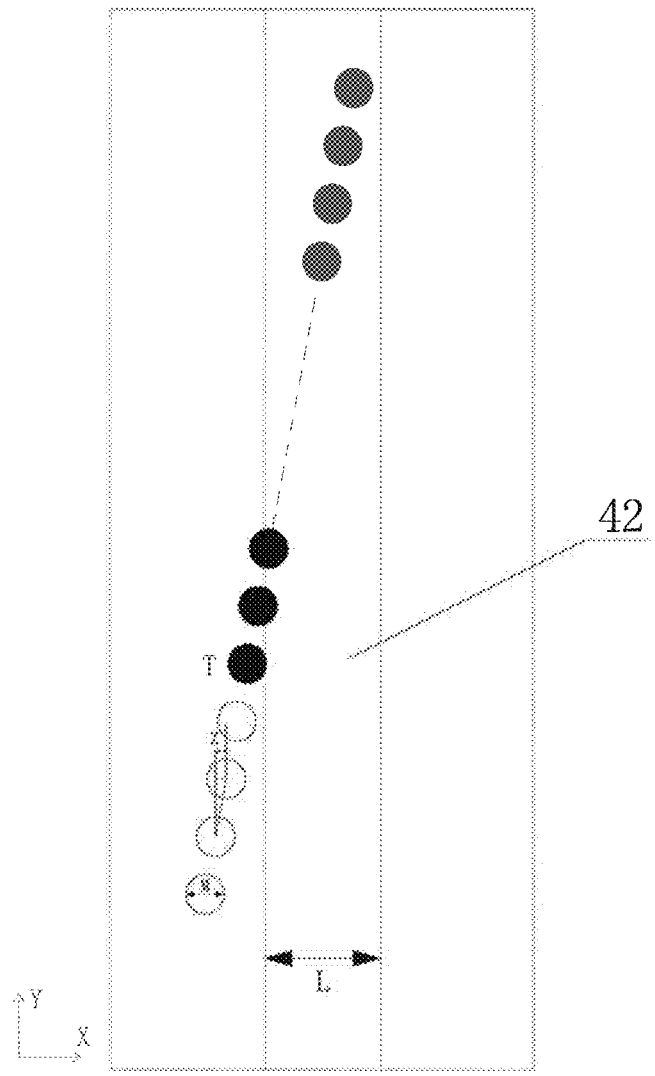
FIG. 5 illustrated a plan view of the relative position between the contact holes in the vertical direction and the poly-silicon gate in a method for monitoring alignment between contact holes and polycrystalline silicon gate according to the disclosure.

FIG. 2 illustrated the plan view of the relative location the contact hole in horizontal direction and the poly-silicon gate in a method for monitoring alignment between contact holes and polycrystalline silicon gate according to the disclosure; FIG. 3 illustrated an enlarged schematic view of part of the contact hole area in FIG. 2 in a method for monitoring alignment between contact holes and polycrystalline silicon gate according to the disclosure; FIG. 4 illustrated the diagram of the structure after the front-end devices is formed in a method for monitoring alignment between contact holes and polycrystalline silicon gate according to the disclosure; FIG. 5 illustrated a plan view of the relative position between the contact holes in the vertical direction and the poly-silicon gate in a method for monitoring alignment between contact holes and polycrystalline silicon gate according to the disclosure.

Illustrated as FIG. 2 and FIG. 3, the method for monitoring alignment between contact holes and polycrystalline silicon gate according to the disclosure comprises the following steps:

First, poly-silicon gate 32 is disposed on the active area of the semiconductor structure 3 along the X-axis direction (Horizontal direction) after the coordinate axis is set.

Then, a plurality of contact holes 33 and contact holes 34 is set along the X-axis (poly-silicon gate electrode 32 in the length direction), the contact hole 33 is located on the poly-silicon gate electrode 32 (including part of the contact holes located on the poly-silicon), the contact hole 34 is completely located on the residual active area 31 (it is also an active area without poly-silicon gate), while the center corresponding to the contact hole 33 and the contact hole 34 are on the same line and such line is non-parallel to the X-axis. The adjacent contact holes are equidistant and have same shape.

Wherein the length of said poly-silicon gate 32 is at least L/Z M*, L is the width of the poly-silicon gate, Z is the interval between the adjacent contact hole along the width of the said poly-silicon gate, M is the diameter of the contact hole.

Finally, observe the contact holes by using electron microscope, as shown in FIG. 3, the luminance of the contact holes 22 on the poly-silicon gate 21 and the contact holes 24 on the active area 23 is different under the electron microscope on the semiconductor structure 2 which formed in the front-end process for manufacturing device structure. The contact holes 22 will be darker with respect to the contact holes 24; Therefore, under an electron microscope, the luminance of the contact holes 33 located on the poly-silicon gate electrode 33 brightness is darker than contact holes 34, so the change of the contact holes can be observed; That is, the luminance of the contact holes 33 connected to the poly-silicon gate 32 and the contact holes 34 on the residual active area 31 is different. The luminance changed when finding the Tth contact hole on the poly-silicon gate 32, and then, calculate the value of misalign in Y-axis direction (the vertical direction) according to the formula $l/2-T*Z$, L is the width of the poly-silicon gate, Z is the interval between the adjacent contact hole along the poly-silicon gate in width, T is the count value of contact hole whose image is begin to change in the row which is composed of contact holes detected by electron method on the poly-silicon gate. One end of the row is disposed on the poly-silicon gate and the other end of row is disposed on active area. In the count rule, the first count contact hole of said row is deposed on the poly-silicon gate and the last count contact hole of said row is deposed on active area. For example, L is 28 nanometer, M is 10 nanometer, Z is 0.5 nanometer, and the luminance changed from the 15th contact hole, so T is 15, thus, the misalign in the Y-axis direction is $L/2-T*Z=28/2-15*0.5=6.5$ nanometer.

FIG. 5 is a plan view of the relative position between the contact holes in the vertical direction and the poly-silicon gate in the method for detecting the alignment of the contact hole and the poly-silicon gate according to the disclosure; illustrated as FIG. 5, poly-silicon gate 42 is provided on the vertical direction and we may get the deviation value in the X-axis is $L/2-T*Z$ in the same way. L is the width of the poly-silicon gate, Z is the interval between the adjacent contact hole along the poly-silicon gate in width, T is the count value of the contact hole whose image is begin to change in the row which is composed of contact holes detected by electron method on the poly-silicon gate.

In summary, due to the above technical solution, the embodiments of the present invention disclosed a method for monitoring alignment between contact holes and poly-silicon gate by observing the luminance change of the contact holes on both horizontal poly-silicon gate and vertical poly-silicon gate under electron microscope and getting the deviation value in vertical direction and horizontal direction from calculation. So we may obtain the profile of the process alignment quantized values in the plan and have a better control of process quality.

The context showed a specific structure of implementation and typical embodiments by description and figure and it may have other conversion based on the spirit of the present invention. Although the above disclosed the preferred embodiments of the present invention, the present invention is not limited by the embodiments described.

For the technicist in the field, any modifications and substitutions will be obvious after reading the description above. So the accompanying claims should be treated as all changes and modifications to the true meaning and scope of the present invention. Any equivalent modifications and substitutions in the range of the present invention's spirit are under the meaning and the scope of the present invention.

The invention claimed is:

1. A method for monitoring alignment between contact holes and polycrystalline silicon gate, comprising the following steps:
   providing a poly-silicon gate on an active area of a semiconductor structure;
   setting a plurality of equidistant contact holes with a same shape on said poly-silicon gate and residual active area; and
   detecting and calculating a deviation value of the aligned process by electron method;
   wherein a length of the poly-silicon gate is determined by the diameter of the contact hole, pitch of contact holes and the width of poly-silicon gate;
   wherein a first contact hole of a row that is comprised of said contact holes is disposed on the poly-silicon gate while a last contact hole of said row is disposed on the active area; and
   wherein said deviation value is $L/2-T*Z$, L is a width of the poly-silicon gate, Z is an interval between adjacent contact holes along the width of said poly-silicon gate, T is a count value of a contact hole disposed on the poly-silicon gate whose luminance begins to change in said contact hole row detected by an electron method.

2. The method of claim 1, wherein the shape of poly-silicon gate is a rectangular structure from plan view.

3. The method of claim 1, wherein an electron microscope is used to detect the contact hole in said step of detecting and calculating the deviation value of the aligned process by electron method.

4. The method of claim 3, wherein the length of said poly-silicon gate is at least L/Z*M, L is the width of the poly-silicon gate, Z is the interval between the adjacent contact hole along the width of the said poly-silicon gate, M is the diameter of the contact hole.

5. The method of claim 1, wherein each contact hole has a circle center and the centers corresponding to said contact holes are on the same line.

6. The method of claim 4, wherein each contact hole has circle center and the centers corresponding to said contact holes are on the same line.

\* \* \* \* \*